United States Patent [19]
Kaimoto

[11] Patent Number: 5,660,969
[45] Date of Patent: Aug. 26, 1997

[54] CHEMICAL AMPLIFICATION RESIST AND A FABRICATION PROCESS OF A SEMICONDUCTOR DEVICE THAT USES SUCH A CHEMICAL AMPLIFICATION RESIST

[75] Inventor: Yuko Kaimoto, Kawasaki, Japan

[73] Assignee: Fujitsu Limited, Kawasaki, Japan

[21] Appl. No.: 607,250

[22] Filed: Mar. 4, 1996

Related U.S. Application Data

[63] Continuation of Ser. No. 297,785, Aug. 30, 1994, abandoned.

[30] Foreign Application Priority Data

Dec. 27, 1993 [JP] Japan ..................................... 5-333352

[51] Int. Cl.$^6$ ..................................................... G03F 7/00
[52] U.S. Cl. ........................ 430/270.1; 430/313; 430/311
[58] Field of Search .............................. 430/270.1, 271.1, 430/311, 313, 326, 327

[56] References Cited

U.S. PATENT DOCUMENTS 5,230,984  7/1993  Tachiki ................................... 430/270

FOREIGN PATENT DOCUMENTS 4-39665   2/1992   Japan .

*Primary Examiner*—Kathleen Duda
*Attorney, Agent, or Firm*—Armstrong, Westerman, Hattori, McLeland & Naughton

[57] ABSTRACT

A chemical amplification resist contains a polymer of adamantyl group and aliphatic ester, wherein the aliphatic ester has a carbonyl group such that the chemical amplification resist generates carboxylic acid upon exposure to radiation.

10 Claims, 3 Drawing Sheets

CHEMICAL AMPLIFICATION RESIST AND A FABRICATION PROCESS OF A SEMICONDUCTOR DEVICE THAT USES SUCH A CHEMICAL AMPLIFICATION RESIST

This application is a continuation of application Ser. No. 08/297,785, filed Aug. 30, 1994, now abandoned.

BACKGROUND OF THE INVENTION

The present invention generally relates to fabrication of semiconductor devices and more particularly to a chemical amplification resist used for patterning a semiconductor layer, as well as to a fabrication process of semiconductor devices that uses such a chemical amplification resist.

Photolithography is an essential process in the fabrication of semiconductor devices. In the art of photolithography, a resist pattern is formed on a semiconductor substrate or a semiconductor layer by applying thereon a photoresist, followed by exposure and development processes of the resist. After the exposure and development, the semiconductor layer is further subjected to an etching process while using the resist pattern thus obtained as a mask. Thus, the photoresist is required to have sufficient sensitivity against the radiation used in the exposure process and simultaneously a sufficient resistance against the etching.

In the conventional fabrication process of semiconductor devices, the radiation of the g-line having a wavelength of 436 nm, or the radiation of the i-line having a wavelength of 365 nm, has been used in the exposure. On the other hand, the demand for increased integration density of recent integrated circuits now requires a submicron resolution for the exposure process. In order to meet the demand of such a high resolution exposure, the use of deep-ultraviolet radiation having a wavelength of 200–300 nm, particularly the use of radiation from an excimer laser, is studied.

When a conventional, so-called Novolac resist, which is based upon a phenolic resin, is used for an exposure process under such deep-ultraviolet radiation, however, there arises a problem in that the aromatic ring of the photoresist, which increases the resistance of the photoresist against etching, causes a strong optical absorption. As a result of such a strong optical absorption, the conventional Novolac resist cannot achieve the desired resolution.

In view of the foregoing unsatisfactory result of the conventional photoresist, there is a proposal, as disclosed in the Japanese Laid-open Patent Publication 4-39665, wherein the reference proposes a chemical amplification resist of a polymer or a co-polymer of acrylic ester or alpha-substitute acrylate that contains adamantyl group. Hereinafter, the photoresist of the foregoing prior art reference will be reviewed briefly.

The photoresist of the prior art is formed of a co-polymer of adamantyl methacrylate having a structural formula of

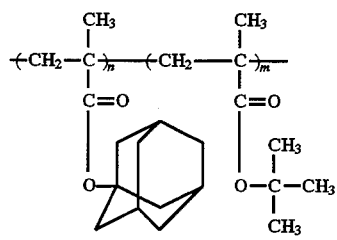

and tert-butylmethacrylate, and further includes a photoacid generator of triphenylsulfonium hexafluoroantimonate represented by the structural formula of

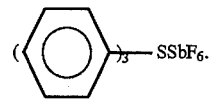

The photoresist itself is hydrophobic in nature and does not dissolve into alkaline solvent, while when the resist is exposed to short wavelength optical radiation, the foregoing photoacid generator releases a strong Bronsted acid. The Bronsted acid thus released catalyzes the cleavage of polymer pendant groups, acid labile groups capable of regenerating the proton, under appropriate conditions represented as

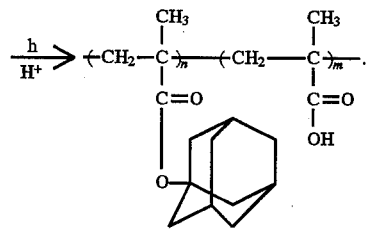

As a result of such a reaction, further release of the Bronsted acid occurs, and the Bronsted acid thus released further promotes the reaction. As a result of such a reaction, the resist changes to methacrylic acid that is soluble to the alkaline solvent. In other words, one can develop the photoresist by means of the alkaline solvent after exposure.

In the conventional chemical amplification resist described above, it should be noted that one cannot provide the resistance against etching that is comparable to the resistance achieved by the conventional novolac resin, unless adamantyl methacrylate is introduced with a proportion of more than 40 mole %, preferably more than 50 mole % with respect to the tert-butylmethacrylate, as indicated in FIG. 1. In FIG. 1, it should be noted that the etch rate of the photoresist is represented as a function of the composition of the resist wherein the compositional parameters n and m correspond to the parameters n and m of the foregoing structural formula.

On the other hand, such an increase in the proportion of the adamantyl group in the photoresist tends to enhance the hydrophobic nature of the resist, and the wetting of the resist by a polar solvent is degraded as a result. More specifically, the permeation of the alkaline solvent into the photoresist is suppressed with increased proportion of adamantyl group and there occurs a case in which the resist remains unremoved after development in correspondence to the area that has been exposed to the optical radiation. Thus, the conventional chemical amplification resist of the foregoing prior art has a problem of reduced sensitivity when a high resistance against dry etching process is to be maintained.

SUMMARY OF THE INVENTION

Accordingly, it is a general object of the present invention to provide a novel and useful chemical amplification resist and a fabrication process of a semiconductor device that uses such a chemical amplification resist wherein the foregoing problems are eliminated.

Another and more specific object of the present invention is to provide a chemical amplification resist having a high resistance against dry etching processes and simultaneously a high sensitivity to short wavelength optical radiation, and a fabrication process of a semiconductor device that uses such a chemical amplification resist.

Another object of the present invention is to provide a chemical amplification resist comprising a polymer of adamantyl group in which a dissolution accelerator is added for increasing the dissolution rate upon development conducted after exposure.

Another object of the present invention is to provide a chemical amplification resist comprising:

a polymer containing adamantyl group; and aliphatic ester added to said polymer;

said aliphatic ester having a carbonyl group such that said chemical amplification resist generates carboxylic acid upon exposure to radiation. According to the present invention, the aliphatic ester having the carbonyl group causes a chemical reaction by the acid generated in the resist as a result of the exposure as

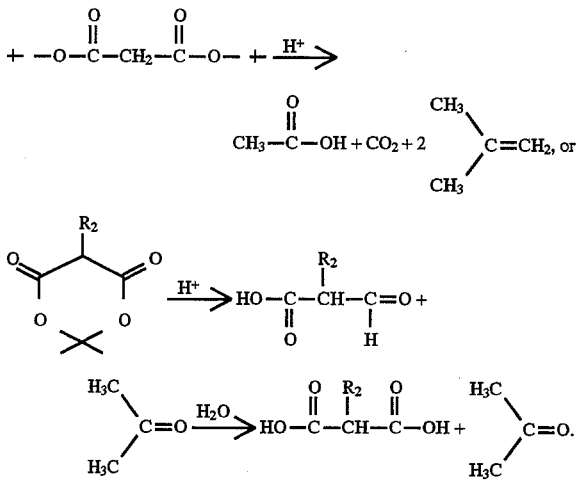

As a result of the foregoing reaction, carboxylic acid is formed and the resist shows an increased solubility to alkalis. Thereby, the problem of the resist remaining on the substrate even after the development by the alkaline solution is eliminated even when the resist contains the adamantyl group with a mole fraction of 50% or more, and one can increase the sensitivity of the photoresist substantially while simultaneously maintaining a high resistance against the dry etching process. Associated with the high sensitivity and high resistance to the dry etching process, the resolution of the resist increases substantially. As the aliphatic ester is a low molecular weight material, one can easily mix the same with the co-polymer that forms the resist in a solvent. Thus, the aliphatic ester acts as a dissolution accelerator in the chemical amplification resist.

Particularly, malonic esters and meldrums acid derivatives are preferred for such a dissolution accelerator. It is preferable to add the dissolution accelerator to the co-polymer of the photoresist with a proportion of 5–25% in weight. When the proportion of the dissolution accelerator is smaller than the foregoing optimum range, sufficient dissolution rate is not attained. On the other hand, when the proportion of the dissolution accelerator exceeds the foregoing optimum range, there arises problems such as dissolution of unexposed part of the resist or degradation in the solubility of the accelerator to the co-polymer of the resist.

In a preferred embodiment of the present invention, the chemical amplification resist comprises a co-polymer of adamantyl methacrylate and tert-butylmethacrylate, and contains photoacid generator that catalyzes the cleavage of tert-butylmethacrylate by releasing an acid upon photolysis.

Other objects and further features of the present invention will become apparent from the following detailed description when read in conjunction with the attached drawings.

DETAILED DESCRIPTION OF PREFERRED EMBODIMENTS

Figure 1:
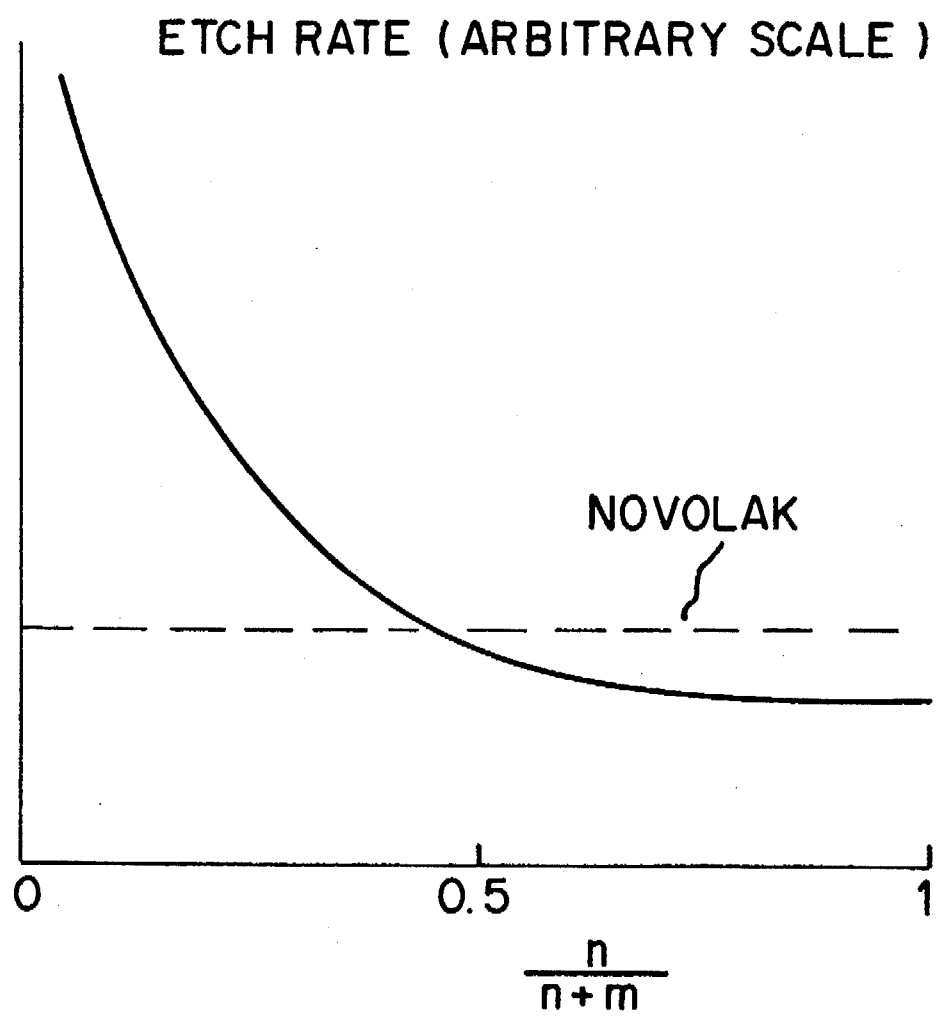
FIG. 1 is a diagram showing the relationship between the resistance against dry etching and the proportion of the adamantyl group contained in the chemical amplification resist.

Hereinafter, preferred embodiments of the present invention will be described with reference to experiments conducted by the inventor.

EXPERIMENT 1

In this experiment, 8.33 g (0.04 mole) of adamantyl methacrylate, 5.68 g (0.04 mole) of tert-butylmethacrylate, and 160 ml (0.5M) of toluene were mixed in a container with 1.9704 g (15 mole %) of azobisisobutyronitrile at 80° C. for 7 hours under a nitrogen atmosphere. The obtained solution was then added with 2.5 l of hexane that contains small amount of hydoroquinone and 25 ml of ethanol. As a result, whitish precipitates were obtained. The precipitates thus obtained were filtered by a G3 glass filter, followed by a desiccation process in a vacuum desiccator at 40° C. for about 6 hours under a reduced pressure of 0.1 mmHg. The whitish powder thus obtained was then dissolved again by tetrahydrofuran, and a solution of about 30 ml was obtained. The solution thus obtained was further admixed with 2.5 l of hexane that contains 25 ml of ethanol to cause a precipitation again. The whitish precipitates thus obtained were then filtered by a G3 glass filter and desiccated in a vacuum desiccator at 40° C. for about 16 hours under a reduced pressure of 0.1 mmHg. As a result, a co-polymer having a molecular weight ($M_w$) of 8600 and a dispersion ($M_w/Mn$) of 1.78 was obtained, wherein it was confirmed that the co-polymer thus obtained contains adamantyl methacrylate and tert-butylmethacrylate with a ratio of 56:44.

The adamantyl methacrylate-tert-butylmethacrylate co-polymer thus obtained was further added with triphenylsulfonium hexafuluoroantimonate as a photoacid generator, with a proportion of 15 weight percent with respect to the co-polymer. Further, commercially available ethyl malonate was added to the co-polymer thus formed with a proportion of 15 weight percent to form a cyclohexanone solution of 14 weight percent.

The solution thus obtained was then spin-coated upon a silicon wafer, followed by a prebake process conducted at 60° C. for 20 minutes. As a result, a resist film having a thickness of 0.65 µm was formed. The resist film thus formed was then subjected to an exposure process in a KrF excimer stepper that uses a radiation of 248 nm wavelength, and a pattern was exposed with a dose of 80 mJ/cm². After the exposure, a post exposure bake process was conducted at 100° C. for 60 seconds, and the substrate thus processed was further subjected to a developing process in a TMAH (tetramethylammonium hydroxide) 2.38% developing solution for 60 seconds. Thereby, it was confirmed that a line-and-space pattern of 0.3 µm pitch is resolved successfully with excellent reproducibility.

EXPERIMENT 2

In the present experiment, triphenylsulfonium hexafluoroantimonate was added to the same co-polymer of adamantyl methacrylate and tert-butylmethacrylate as in the EXPERIMENT 1 as a photoacid generator, with a proportion of 15 weight percent. Further, commercially available tert-butyl malonate was added to the co-polymer with a proportion of 15 weight percent to form a cyclohexanone solution of 14 weight percent. The solution thus obtained was applied on a silicon wafer by a spin coating process, followed by a prebake process conducted at 60° C. for 20 minutes. As a result, a resist film having a thickness of 0.65 µm was obtained. The resist film thus formed was then subjected to an exposure process in the foregoing KrF excimer stepper, and a pattern was exposed with a dose of 40 mJ/cm$^2$. After the exposure, a post exposure bake process was conducted at 100° C. for 60 seconds, and the substrate thus processed was further subjected to a developing process in the TMAH 2.38% solution for 60 seconds. Thereby, it was confirmed that a line-and-space pattern of 0.3 µm pitch is resolved successfully with excellent reproducibility.

COMPARATIVE EXPERIMENT 1

In the present comparative experiment, triphenylsulfonium hexafluoroantimonate was added to the same co-polymer of adamantyl methacrylate and tert-butylmethacrylate as used in the EXPERIMENT 1 as a photoacid generator with a proportion of 15 weight percent to form a cyclohexanone solution of 14 weight percent. The addition of ethyl malonate or tert-butyl malonate was not conducted. The solution thus obtained was applied on a silicon wafer by a spin coating process, followed by a prebake process conducted at 60° C. for 20 minutes to form a resist film having a thickness of 0.65 µm. The resist film thus formed was then subjected to an exposure process in the foregoing KrF excimer stepper, and a pattern was exposed with a dose of 210 mJ/cm$^2$. After the exposure, a post exposure bake process was conducted at 100° C. for 60 seconds, and the substrate thus processed was further subjected to a developing process in the TMAH 2.38% solution for 60 seconds. In this case, it was observed that the pitch of the line-and-space pattern that can be exposed with reproducibility is limited to be 0.4 µm or larger.

EXPERIMENT 3

In this experiment, 10.00 g (0.048 mole) of adamantyle methacrylate, 4.55 g (0.032 mole) of tert-butylmethacrylate, and 160 ml (0.5M) of toluene were mixed in a container with 1.9704 g (15 mole %) of azobisisobutyronitrile at 80° C. for 7 hours under a nitrogen atmosphere. The obtained solution was then added with 2.5 l of hexane that contains small amount of hydoroquinone and 25 ml of ethanol. As a result, whitish precipitates were obtained. The precipitates thus obtained were filtered by a G3 glass filter, followed by a desiccation process in a vacuum desiccator at 40° C. for about 6 hours under a reduced pressure of 0.1 mmHg. The whitish powder thus obtained was then dissolved again by tetrahydrofuran, and a solution of about 30 ml was obtained. The solution thus obtained was further admixed with 2.5 l of hexane that contains 25 ml of ethanol to cause a precipitation again. The whitish precipitates thus obtained were then filtered by a G3 glass filter and desiccated in a vacuum desiccator at 40° C. for about 16 hours under a reduced pressure of 0.1 mmHg. As a result, a co-polymer having a molecular weight ($M_W$) of 7900 and a dispersion ($M_W/Mn$) of 1.82 was obtained, wherein it was confirmed that the co-polymer thus obtained contains adamantyl methacrylate and tert-butylmethacrylate with a ratio of 61:49.

The adamantyl methacrylate-tert-butylmethacrylate co-polymer thus obtained was further added with triphenylsulfonium hexafuluoroantimonate as a photoacid generator, with a proportion of 15 weight percent with respect to the co-polymer. Further, meldrums acid was added to the co-polymer thus formed with a proportion of 15 weight percent to form a cyclohexanone solution of 13 weight percent.

The solution thus obtained was then applied upon a silicon wafer by a spin coating process, followed by a prebake process conducted at 60° C. for 20 minutes. As a result, a resist film having a thickness of 0.65 µm was formed. The resist film thus formed was then subjected to an exposure process in the foregoing KrF excimer stepper, and a pattern was exposed with a dose of 60 mJ/cm$^2$. After the exposure, a post exposure bake process was conducted at 100° C. for 60 seconds, and the substrate thus processed was further subjected to a developing process in the TMAH 2.38% solution for 60 seconds. Thereby, it was confirmed that a line-and-space pattern of 0.35 µm pitch is resolved successfully with excellent reproducibility.

COMPARATIVE EXPERIMENT 2

In the present comparative experiment, triphenylsulfonium hexafluoroantimonate was added to the same co-polymer of adamantyl methacrylate and tert-butylmethacrylate as used in the EXPERIMENT 3 as a photoacid generator with a proportion of 15 weight percent to form a cyclohexanone solution of 15 weight percent. The addition of meldrums acid was not conducted. The solution thus obtained was applied on a silicon wafer by a spin coating process, followed by a prebake process conducted at 60° C. for 20 minutes to form a resist film having a thickness of 0.65 µm. The resist film thus formed was then subjected to an exposure process in the foregoing KrF excimer stepper, and a pattern was exposed with a dose of 380 mJ/cm$^2$. After the exposure, a post exposure bake process was conducted at 100° C. for 60 seconds, and the substrate thus processed was further subjected to a developing process in the TMAH 2.38% solution for 60 seconds. In this case, it was observed that the pitch of the line-and-space pattern that can be exposed with reproducibility is limited to be 0.4 µm or larger.

COMPARATIVE EXPERIMENT 3

In the present comparative experiment, triphenylsulfonium hexafluoroantimonate was added to the same co-polymer of adamantyl methacrylate and tert-butylmethacrylate as used in the EXPERIMENT 3 as a photoacid generator with a proportion of 15 weight percent. Further, methylmeldrums acid was added to the co-polymer with a proportion of 28 weight percent to form a cyclohexanone solution of 15 weight percent. The solution thus obtained was then applied on a silicon wafer by a spin coating process, followed by a prebake process conducted at 60° C. for 20 minutes to form a resist film having a thickness of 0.65 µm. The resist film thus formed was then subjected to an exposure process in the foregoing KrF excimer stepper. After the exposure, a post exposure bake process was conducted at 100° C. for 60 seconds, and the substrate thus processed was further subjected to a developing process in a TMAH 2.38% solution for 60 seconds. In this case, it was observed that the unexposed part of the resist is dissolved as a result of development, irrespective of the dose of exposure. Thus, no satisfactory resist pattern was obtained.

Summarizing the above, it was found that dissolution accelerator such as malonic esters and meldrums acid derivatives are effective for increasing the sensitivity of the chemical amplification resist while simultaneously maintaining a high resistance against dry etching process. Further, it was found that addition of the dissolution accelerator to the co-polymer of the photoresist with a proportion of 5–25% in weight is preferable.

Next, the fabrication process of a semiconductor device that uses the chemical amplification resist of the present invention will be described with reference to FIGS. 2A–2C.

Figure 2A:
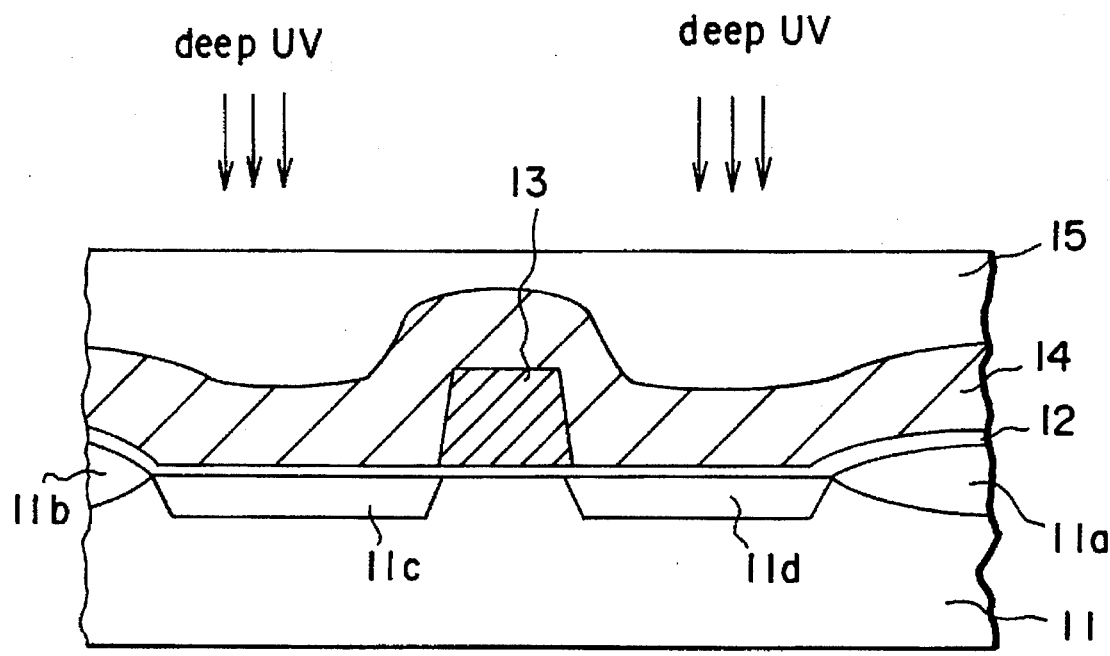
FIGS. 2A–2C show the process of fabricating a semiconductor device by using the photoresist of the present invention.
Figure 2B:
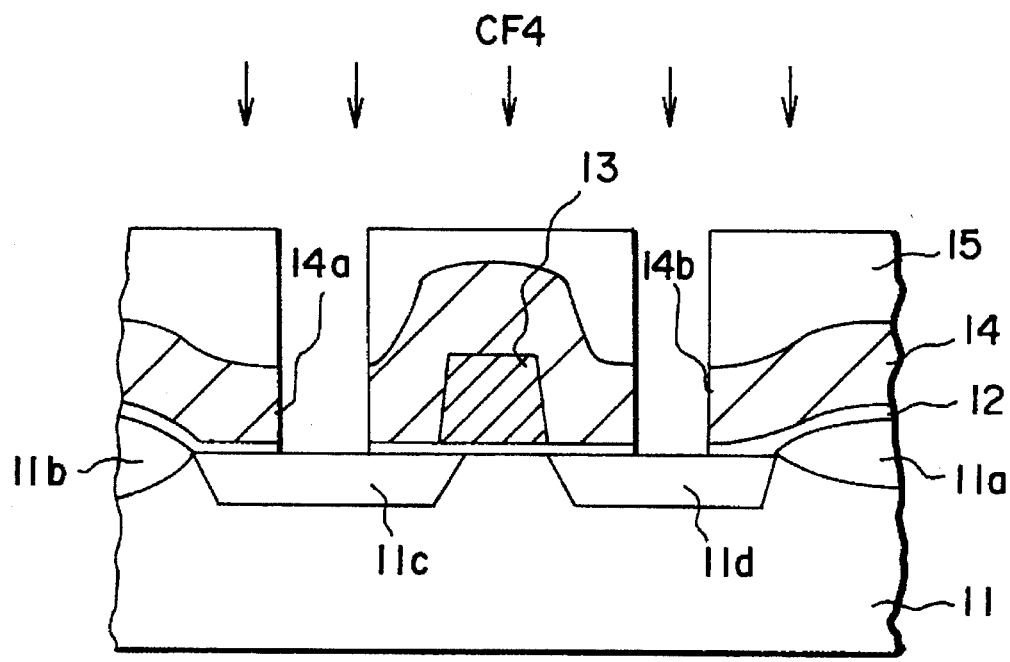
Figure 2C:
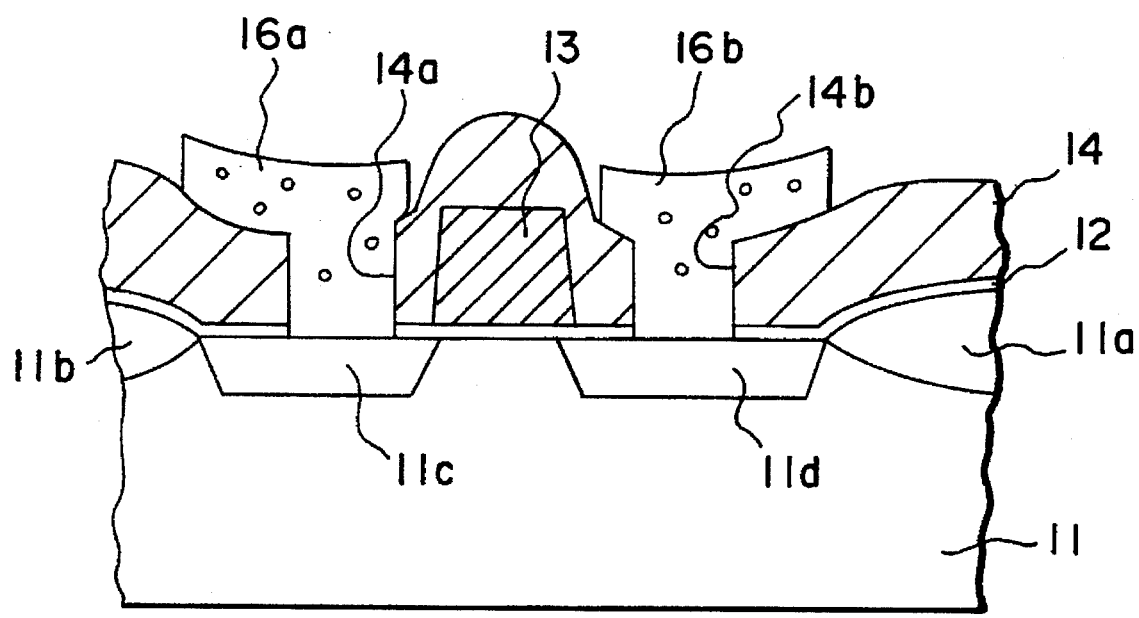

Referring to FIG. 2A, there is formed a MOS transistor on a p-type silicon substrate 11 in correspondence to a device region defined by a field oxide films 11a and 11b. In correspondence to the device region, the substrate 11 is formed with n-type source and drain regions 11c and 11d such that the source and drain regions sandwich laterally a p-type channel region. The surface of the substrate 11 is covered by a thin oxide film 12 and a gate electrode 13 is formed on the oxide film 12 in correspondence to the channel region. Further, an insulator layer 14 is deposited by a CVD process such that the insulator layer 13 buries the gate electrode 14 underneath. As the fabrication of such a structure is well known in the art, further description about the formation of the structure of FIG. 2A will be omitted.

In the structure of FIG. 2A, a photoresist layer according to any of the foregoing embodiments is provided with a thickness of 0.5–0.6 μm by a spin coating process. Further, the photoresist layer thus provided is exposed by an ultraviolet radiation having a wavelength in the deep-ultraviolet band between 200–300 nm, such as the one produced by the excimer laser, in correspondence to the region where contact holes are to be formed in the insulator layer 14. After the exposure, the photoresist layer is developed by the TMAH solution, and one obtains the structure shown in FIG. 2B, in which the photoresist layer 15 now forms a resist mask.

Next, while using the patterned photoresist layer 15 as a mask, the insulator layer 14 is subjected to a dry etching process that may use an etching gas such as $CF_4$. As a result, contact holes 14a and 14b are formed in the insulator layer 14 as indicated in FIG. 2C. Further, by providing aluminum patterns 16a and 16b in correspondence to the contact holes 14a and 14b, the MOS transistor is obtained as shown in FIG. 2C.

As already described, the photoresist according to the present invention contains the adamantyl group with a proportion of 50 mole percent or more, and because of this, the photoresist shows an excellent resistance against the dry etching process. Further by adding suitable amount of malonic esters or meldrums acid derivatives, the photoresist of the present invention provides a high resolution patterning, free from residue after development. In other words, the chemical amplification resist of the present invention is suitable for the fabrication of submicron semiconductor devices and integrated circuits having a very large integration density.

Further, the present invention is not limited to the embodiments described heretofore, but various variations and modifications may be made without departing from the scope of the invention.

What is claimed is:

1. A chemical amplification resist comprising:
 a polymer containing 40 mol % or more of an adamantyl group; and
 an aliphatic ester compound added to said polymer;
 said aliphatic ester compound having a carbonyl group that generates carboxylic acid upon exposure to radiation.

2. A chemical amplification resist as claimed in claim 1, wherein said aliphatic ester compound comprises a malonic ester having a structural formula of

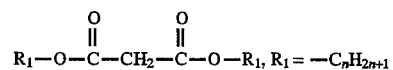

wherein n is an integer in the range from 1 to 4.

3. A chemical amplification resist as claimed in claim 1, wherein said aliphatic ester compound comprises a meldrums acid derivative having a structural formula of

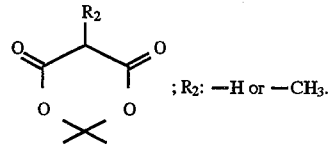

4. A chemical amplification resist as claimed in claim 1, wherein said aliphatic ester compound is added to said polymer with a proportion in a range between 5–25 weight percent based on the polymer weight.

5. A chemical amplification resist as claimed in claim 1, wherein said polymer comprises a co-polymer of adamantyl methacrylate and tert-butylmethacrylate, said co-polymer further containing a photoacid generator.

6. A method for fabricating a semiconductor device, comprising the steps of:
 applying a chemical amplification resist on a semiconductor substrate, said chemical amplification resist comprising a polymer containing 40 mol % or more of an adamantyl group; and an aliphatic ester compound added to said polymer, said aliphatic ester compound having a carbonyl group that generates carboxylic acid upon exposure;
 exposing a pattern on said chemical amplification resist to radiation;
 developing said chemical amplification resist exposed to said radiation by an alkaline developing solution to form a resist pattern; and
 etching said substrate while using said resist pattern as an etching mask.

7. A method as claimed in claim 6, wherein said aliphatic ester comprises a malonic ester having a structural formula of

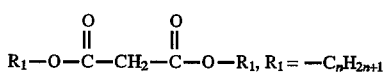

wherein n is an integer in the range from 1 to 4.

8. A method as claimed in claim 6, wherein said aliphatic ester compound comprises a meldrums acid derivative having a structural formula of

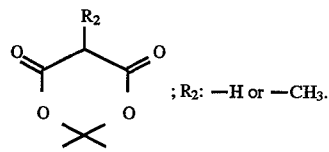

9. A method as claimed in claim 6, wherein said aliphatic ester compound is added to said polymer with a proportion in a range between 5–25 weight percent based on the polymer weight.

10. A method as claimed in claim 6, wherein said polymer comprises a co-polymer of adamantyl methacrylate and tert-butylmethacrylate, said co-polymer further containing a photoacid generator.

* * * * *